United States Patent
Wolff et al.

(10) Patent No.: US 10,459,024 B2
(45) Date of Patent: Oct. 29, 2019

(54) SHORTED THERMOCOUPLE DIAGNOSTIC

(71) Applicant: Rosemount Inc., Shakopee, MN (US)

(72) Inventors: Corey Gerald Wolff, Plymouth, MN (US); Randy Kenneth Paschke, Golden Valley, MN (US)

(73) Assignee: ROSEMOUNT INC., Shakopee, MN (US)

( * ) Notice: Subject to any disclaimer, the term of this patent is extended or adjusted under 35 U.S.C. 154(b) by 273 days.

(21) Appl. No.: 15/388,316

(22) Filed: Dec. 22, 2016

(65) Prior Publication Data
US 2018/0180656 A1   Jun. 28, 2018

(51) Int. Cl.
*G01K 15/00* (2006.01)
*G01K 7/02* (2006.01)
*G01R 31/02* (2006.01)

(52) U.S. Cl.
CPC ............ *G01R 31/025* (2013.01); *G01K 7/02* (2013.01); *G01K 7/026* (2013.01); *G01K 15/007* (2013.01)

(58) Field of Classification Search
CPC ........ G01K 15/007; G01K 7/02; G01K 7/026; G01R 31/025
USPC ................... 374/179; 702/99, 130, 179, 183
See application file for complete search history.

(56) References Cited

U.S. PATENT DOCUMENTS

| 5,281,956 | A | 1/1994 | Bashark | |
|---|---|---|---|---|
| 6,197,646 | B1 * | 3/2001 | Goto | H01L 21/28052 257/E21.165 |
| 6,344,747 | B1 | 2/2002 | Longhofer et al. | |
| 8,069,001 | B1 * | 11/2011 | Gorbunov | G01K 1/022 600/549 |
| 9,222,844 | B2 | 12/2015 | Rud | |
| 10,209,143 | B2 | 2/2019 | Lugli | |
| 2010/0202491 | A1 * | 8/2010 | Harrington | G01K 7/02 374/171 |
| 2012/0213245 | A1 * | 8/2012 | Noda | G01J 5/0896 374/44 |
| 2014/0145858 | A1 * | 5/2014 | Miller | G08C 17/02 340/870.07 |

(Continued)

FOREIGN PATENT DOCUMENTS

| CA | 1 311 028 | 12/1995 |
|---|---|---|
| CA | 2 808 209 | 8/2014 |
| CN | 1038880 | 1/1990 |

(Continued)

OTHER PUBLICATIONS

First Office Action from Chinese Patent Application No. 201720356133.1, dated Dec. 15, 2017, 4 pages.

(Continued)

*Primary Examiner* — John E Breene
*Assistant Examiner* — Jeffrey P Aiello
(74) *Attorney, Agent, or Firm* — Westman, Champlin & Koehler, P.A.

(57) ABSTRACT

A temperature transmitter assembly includes a thermocouple and a temperature transmitter. The thermocouple has a first conductor and a second conductor connected to each other at a junction. The temperature transmitter has diagnostics that determines a resistance of the thermocouple and based on the determined resistance, provides an indication of whether the first conductor and the second conductor are shorted together before the junction.

19 Claims, 4 Drawing Sheets

(56) References Cited

U.S. PATENT DOCUMENTS

2015/0304487 A1* 10/2015 Chaput ............... F16B 2/10
  248/550
2016/0273976 A1* 9/2016 Lugli ............... G01K 7/026

FOREIGN PATENT DOCUMENTS

| CN | 203323907 | 12/2013 |
|----|-----------|---------|
| CN | 105987774 | 10/2016 |
| EP | 3 070 446 | 9/2016 |
| JP | 06-201484 | 7/1994 |

OTHER PUBLICATIONS

First Correction Notification from Chinese Patent Application No. 201720356133.1, dated Oct. 10, 2017, 2 pages.
Brochure entitled "Practical Temperature Measurements" from Agilent Technologies, dated Jan. 26, 2012.
Notification of Transmittal of the International Search Report and the Written Opinion of the International Searching Authority from PCT/US2017/064426, dated Mar. 23, 2018.
Communication from European Patent Application No. 17829758.6, dated Aug. 27, 2019.
Office Action from Chinese Patent Application No. 201710222400.0, dated Jun. 24, 2019.

* cited by examiner

SHORTED THERMOCOUPLE DIAGNOSTIC

BACKGROUND

Thermocouples are temperature sensors consisting of two conductors that are joined together at a junction and that have two free ends spaced apart from the junction. The conductors are made of different metals such that when a temperature gradient is applied between the free ends and the junction, a voltage appears between the free ends. The size of the voltage corresponds to the size of the temperature gradient. As a result, using the voltage and the temperature at the free ends, it is possible to determine the temperature at the junction.

If the conductors of the thermocouple come in contact with each other between the free ends and the junction, they create a short in the thermocouple that produces a new junction. When this occurs, the voltage produced at the free ends of the thermocouple corresponds to the temperature at the new junction created by the short and not at the original junction of the thermocouple. Because of this, temperature calculations produced from the voltage will not accurately reflect the temperature at the original junction if there is a temperature differential between the location of the short and the original junction.

In process control environments, thermocouples are often used to measure the temperature of a process fluid since they can withstand a wide range of process temperatures. Typically, the free ends of the thermocouple are connected to the interior of a temperature transmitter, which measures the voltage between the free ends of the thermocouple, measures the temperature within the transmitter at the free ends, and uses the temperature in the transmitter and the voltage across the thermocouple to calculate the temperature at the junction. This junction temperature is then communicated to one or more other process devices located in the process environment or to a control room either over a wired or wireless connection.

SUMMARY

A temperature transmitter assembly includes a thermocouple and a temperature transmitter. The thermocouple has a first conductor and a second conductor connected to each other at a junction. The temperature transmitter has diagnostics that determine a resistance of the thermocouple and based on the determined resistance, provide an indication of whether the first conductor and the second conductor are shorted together before the junction.

In a further embodiment, a temperature transmitter includes a digital processor and a communication interface. The digital processor is configured to execute temperature calculations that calculate a temperature of a portion of a thermocouple based on a measured voltage across the thermocouple and shorting diagnostics that determine a measured resistance of the thermocouple and that use the measured resistance and the temperature to determine whether conductors of the thermal couple have shorted together before a hot junction of the thermocouple. The communication interface communicates to another process device that the conductors of the thermal couple have shorted together.

In a still further embodiment, a temperature transmitter includes a processor that performs temperature calculations based on a voltage measured across points of a thermocouple to provide a temperature value for a junction of the thermocouple and diagnostics that determine a resistance of the thermocouple and based on the determined resistance, provide an indication of whether the first conductor and the second conductor are shorted together before the junction.

This Summary and the Abstract are provided to introduce a selection of concepts in a simplified form that are further described below in the Detailed Description. The Summary and the Abstract are not intended to identify key features or essential features of the claimed subject matter, nor are they intended to be used as an aid in determining the scope of the claimed subject matter.

DETAILED DESCRIPTION OF ILLUSTRATIVE EMBODIMENTS

Figure 1:
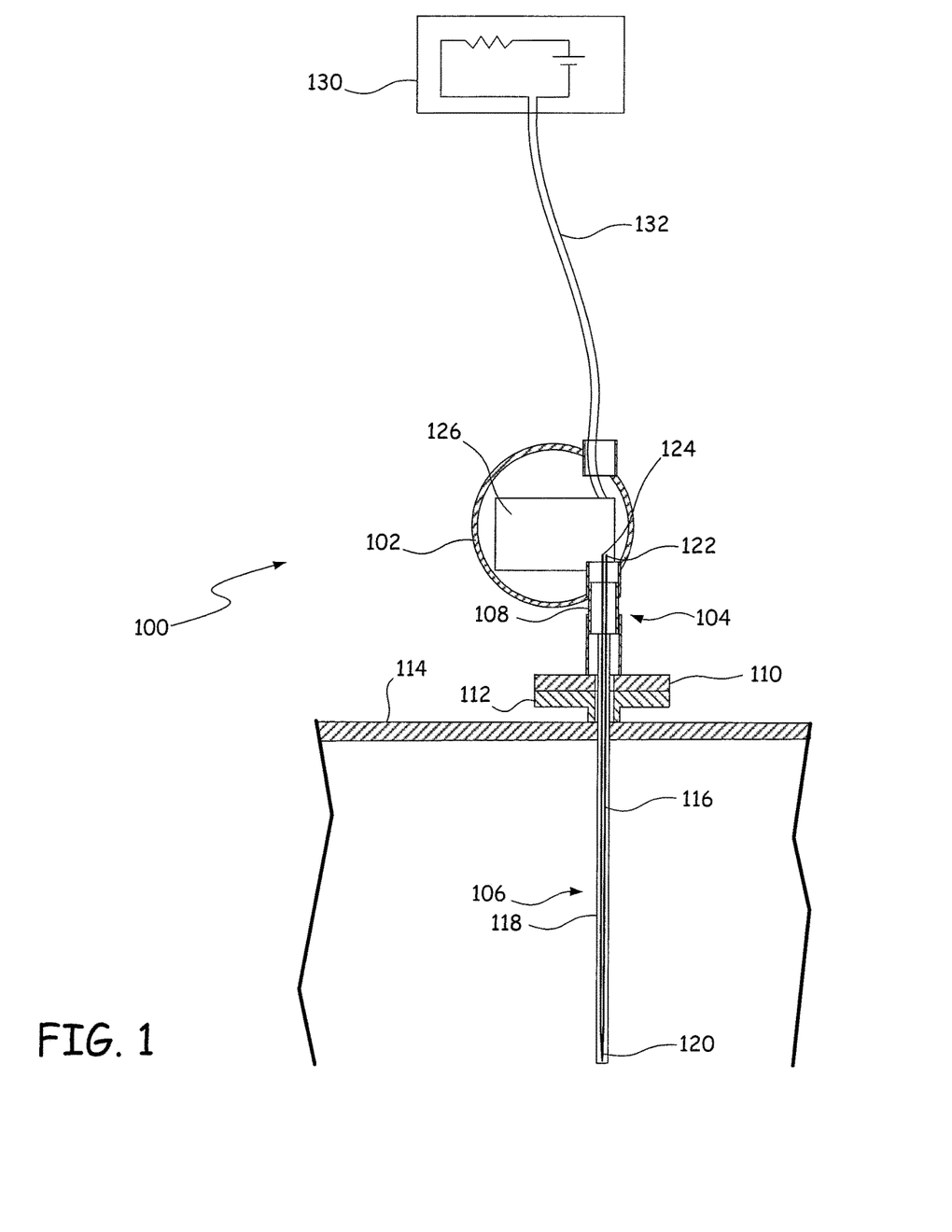
FIG. 1 provides a plan view of a process control system with a temperature sensor.

FIG. 1 provides a plan view of a portion of a process control system 100 showing some elements in cross-section. System 100 includes a process temperature transmitter 102 that is mounted on a thermocouple assembly 104 consisting of a thermocouple 106 mounted within a protective sheath 108. Together, temperature transmitter 102 and thermocouple assembly 104 form a temperature transmitter assembly. Protective sheath 108 is threaded into a mounting flange 110 that is mounted on a corresponding mounting flange 112 on a process conduit 114. Thermocouple 106 includes two conductors 116 and 118 that are made out of different metals and that are joined at a junction 120, often referred to as a "hot" junction. Conductors 116 and 118 have free ends 122 and 124 that are electrically connected to electric components on one or more printed circuit boards 126 in process temperature transmitter 102. Although conductors 116 and 118 are shown to be long enough to permit process temperature transmitter 102 to be mounted directly to process conduit 114, in other embodiments, conductors 116 and 118 can be extended using extension wires of the same respective material to allow process temperature transmitter 102 to be mounted remotely from process conduit 114. When extension wires are used, free ends 122 and 124 of conductors 116 and 118 are still considered to be located in process temperature transmitter 102 and the entire length of conductors (whether considered extension wire or not) from the free ends to the hot junction are considered to form conductors 116 and 118. A communication interface on printed circuit boards 126 communicates with a control room 130 over a two-wire process loop 132. Although a two-wire process control loop is shown in FIG. 1, the communication interface alternatively communicates using other wired and wireless connections. In addition, although temperature transmitter 102 is shown communicating with control room 130 in FIG. 1, in other embodiments, temperature transmitter 102 communicates with other process control devices in addition to or instead of communicating with control room 130.

Figure 2:
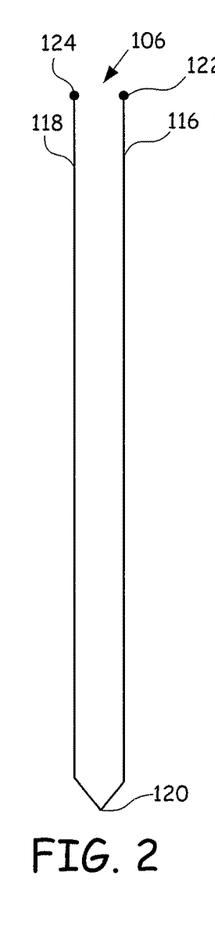
FIG. 2 shows an example of a thermocouple.
Figure 3:
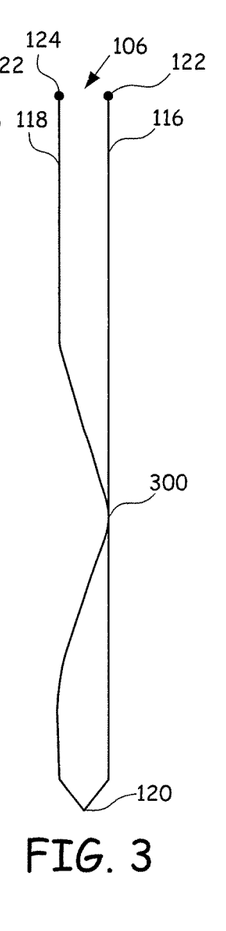
FIG. 3 shows the thermocouple of FIG. 2 in a short condition.

FIG. 2 provides an enlarged view of thermocouple 106 showing conductors 116 and 118 having free ends 122 and 124 and being joined at junction 120. FIG. 3 shows thermocouple 106 in a short condition where conductors 118 and 116 are in contact at a point 300 between hot junction 120 and free ends 124 and 122. The location of point 300 can be within the casing of thermocouple 106 or along the extension wires (if any) As a result of the contact at point 300, the voltage provided between free ends 122 and 124 reflects the temperature at point 300 instead of the temperature at hot junction 120.

Figure 4:
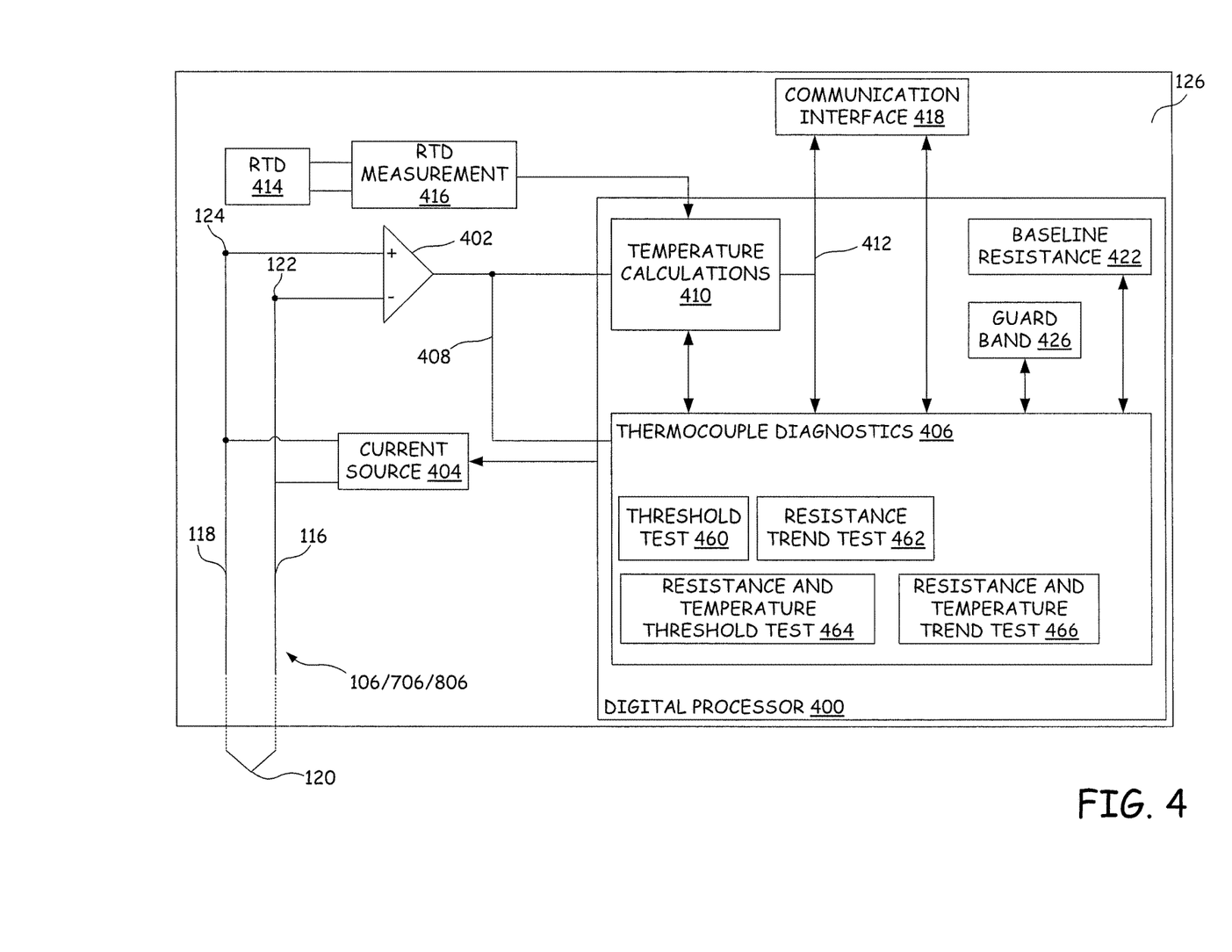
FIG. 4 shows a block diagram of elements in a temperature transmitter in accordance with one embodiment.

FIG. 4 provides a block diagram showing various electronic components on the one or more printed circuit boards 126 of process temperature transmitter 102 that can be used to determine the temperature of the point of contact between thermocouple conductors 116 and 118, communicate the temperature to the control room or other process devices and detect when a short condition exists in thermocouple 106, such as the short condition shown in FIG. 3.

The electronics in process temperature transmitter 102 for determining the temperature of hot junction 120 include a digital processor 400, a voltage amplifier 402, an RTD sensor 414 and RTD measurement circuit 416. Voltage amplifier 402 is connected to free ends 124 and 122 of thermocouple 106 and provides an amplified thermocouple voltage 408 to temperature calculations 410 that are executed by digital processor 400. RTD measurement circuit 416 passes a current through RTD sensor 414 to determine a resistance of RTD sensor 414. RTD measurement circuit 416 uses the determined resistance of RTD sensor 414 to identify the temperature of RTD sensor 414 and provides the temperature to temperature calculations 410. Temperature calculations 410 use the temperature of RTD sensor 414 as the temperature of free ends 122 and 124 of thermocouple 120, often referred to as the reference temperature of the thermocouple. Using this reference temperature and amplified thermocouple voltage 408, temperature calculations 410 determine a temperature 412 for the point of contact between thermocouple conductors 116 and 118. Temperature 412 is provided to communication interface 418, which sends temperature 412 to one or more other processing devices or control rooms using any type of desired communication channel including a two-wire process control loop and wireless communication.

Thermocouple diagnostics 406 are executed by digital processor 400 to identify when a short condition exists in thermocouple 106. Thermocouple diagnostics 406 utilizes one or more diagnostic tests 460, 462, 464, and 466 discussed further below. Each of these diagnostic tests relies in part on the fact that the resistance along a thermocouple circuit changes when a short appears in the thermocouple circuit. Specifically, without a short in the thermocouple, current applied to free end 122 of thermocouple 106 will pass along the entire length of conductor 116 (including any extension wires), through junction 120 and back along the entire length of conductor 118 (including any extension wires). Since conductors 116 and 118 have respective resistances per unit length, the total resistance to the current is equal to the total length of conductor 116 (including the length of any extension wire) times conductor 116's resistance per unit length plus the total length of conductor 118 (including any extension wire) times conductor 118's resistance per unit length. However, when a short is present in the thermocouple, the applied current will pass along conductor 116 to the location of the short and then back along conductor 118 to free end 124. Since this second path is shorter than the first path, the total resistance when a short is present in the thermocouple is less than when a short is not present.

To measure the resistance of the thermocouple, thermocouple diagnostics 406 use a current source 404 to apply a current to thermocouple 106. Because of the resistance of the thermocouple, this current will generate a voltage across free ends 122 and 124 that is amplified by voltage amplifier 402 to produce amplified thermocouple voltage 408. The amount of current applied by current source is then used with amplified thermocouple voltage 408 to determine the resistance of thermocouple 106.

Because the applied current from current source 404 changes the voltage across free ends 122 and 124, some embodiments do not use amplified thermocouple voltage 408 to calculate temperature 412 when thermocouple diagnostics 406 is applying a current to thermocouple 106. In one such embodiment, thermocouple diagnostics 406 sets or passes a value that causes temperature calculations 410 to pause while the resistance diagnostics are being performed.

In accordance with one embodiment, when thermocouple diagnostics 406 determine that a short has developed in thermocouple 106, thermocouple diagnostics 406 send an indication of the short to a control room or other process device through communication interface 418. In accordance with one embodiment, this indication is an alert message conveying that there is a short in the thermocouple.

Resistance Threshold Test 460

One of the thermocouple diagnostic tests is resistance threshold test 460, which detects a short in thermocouple 106 by periodically measuring the resistance of thermocouple 106 and identifying a short when the resistance of thermocouple 106 drops below some threshold. Resistance threshold test 460 starts by measuring a baseline resistance 422, which is stored in memory associated with digital processor 400. At regular intervals, resistance threshold test 460 interrupts temperature calculations 410 to measure a new resistance value for thermocouple 106. Resistance threshold test 460 then calculates the difference between baseline resistance and the measured resistance and determines if the difference is greater than a guard band value 426. Guard band value 426 is selected to accommodate fluctuations in the thermocouple resistance that can occur even when a short is not present. If the difference between baseline resistance 422 and the measure resistance is greater than guard band 426, thermocouple diagnostics 406 provides an indication that the thermocouple conductors are shorted to communication interface 418, which communicates the indication to the control room or other process devices.

Resistance Trend Line Test 462

A second thermocouple diagnostics test is resistance trend test 462. Resistance trend test 426 periodically measures the thermocouple resistance and stores the last n measurements. A trend line is then determined from the last n resistance measurements and the slope of that line is examined to determine if it is sufficiently negative to warrant issuing an indication that the thermocouple has shorted. If the slope is sufficiently negative, thermocouple diagnostics 406 provide the indication that the thermocouple conductors have shorted to communication interface 418, which then provides the indication to a control room and/or other process devices.

Using Temperature and Thermocouple Resistance

Resistance threshold test 460 and resistance trend line test 462 both require periodic testing of the thermocouple resistance. This is undesirable because it interrupts temperature calculations 410 and thus can delay the delivery of hot junction temperature 412. It is also undesirable because it requires additional power to drive current source 404 during the resistance measurements.

In addition, to avoid issuing erroneous short alerts, guard band 426 used in resistance threshold test 460 and the size of the negative slope used in resistance trend line test 462 are set to require a substantial reduction in the resistance of thermocouple before a short alert is issued. This is undesirable because it may cause some short conditions to be missed by the tests.

To overcome these problems, resistance and temperature threshold test 464 and resistance and temperature trend test 466, described below, use a combination of temperature values 412 and thermocouple resistance values to identify when a short condition exists in thermocouple 106.

Figure 5:
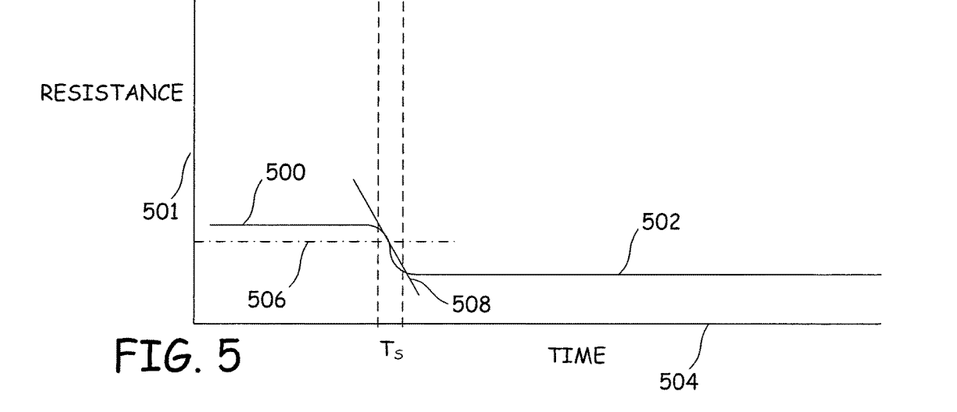
FIG. 5 provides a graph of resistance as a function of time.
Figure 6:
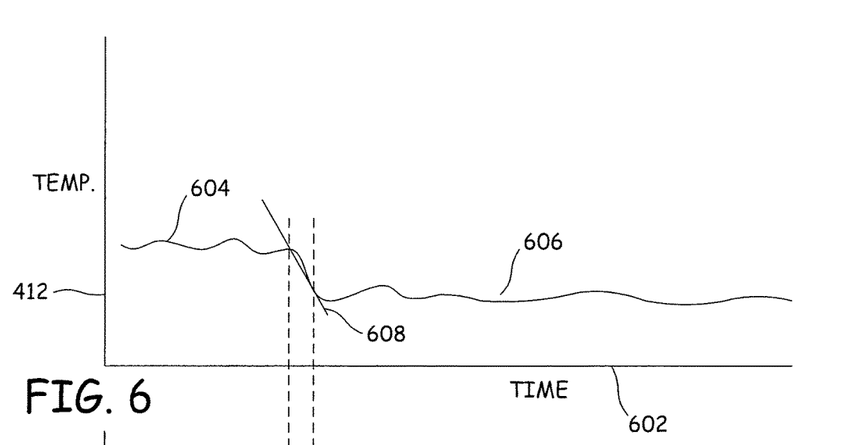
FIG. 6 provides a graph of a measured thermocouple temperature as a function of time aligned with the time graph of FIG. 5.

FIG. 5 shows a graph of thermocouple resistance 501 as a function of time 504 when a short condition develops at time $t_s$. Before the short condition, the thermocouple has a baseline resistance 500 and after the short, the resistance of the thermocouple has dropped to a measured resistance 502. FIG. 6 provides a graph of thermocouple temperature 412 as a function of time 602 where time 602 is aligned with time 504 of the graph of FIG. 5. As shown in FIG. 6, when the resistance of thermocouple 106 drops during a short condition, the measured temperature also drops from an initial temperature 604 to a lower temperature 606. This correlation between a change in the temperature and a change in the thermocouple resistance during a thermocouple short is used in tests 464 and 466 of thermocouple diagnostics 406 to improve the accuracy of determining when the first conductor and the second conductor are shorted together.

Temperature and Resistance Threshold Test 464

In one embodiment of temperature and resistance threshold test 464, excessive testing of the resistance of thermocouple 106 is avoided by using temperatures 412 to trigger when the resistance is measured. A baseline resistance for the thermocouple is initially determined using current source 404 and amplified thermocouple voltage 408 and is stored as baseline resistance 422 by digital processor 400. Temperature and resistance threshold test 464 then monitors temperatures 412 and does not re-measure the resistance of thermocouple 106 unless the temperature provided by the thermocouple drops by more than a threshold amount over a designated period of time. When the temperature drops by more than the threshold amount, temperature and resistance threshold test 464 activates current source 404 and uses amplified thermocouple voltage 408 to measure the resistance of thermocouple 106. The difference between baseline resistance 422 and the measured resistance is then compared to a threshold. If the difference exceeds the threshold, the indication that the thermocouple conductors have shorted is issued by thermocouple diagnostics 406 to communication interface 418, which transmits the indication to the control room and/or to other process devices.

In accordance with one embodiment, the resistance threshold is based in part on the lower temperature of the thermocouple. When thermocouple 106 is exposed to a lower temperature, the resistance of thermocouple 106 will drop even when a short is not present. By including this temperature-dependent resistance drop into the threshold, resistance changes that are due only to a change in temperature of the thermocouple will not trigger an indication that there is a short in the thermocouple.

In other embodiments of temperature and resistance threshold test 464, the resistance of thermocouple 106 is periodically measured and for each measurement, a respective difference between the measured resistance and baseline resistance 422 is compared to a threshold. In addition, a history of temperature values 412 is stored. When the difference in the resistances exceeds the threshold, the history of temperature values 412 is examined to determine if the temperature dropped at the same time that the resistance dropped by more than the threshold amount. If the temperature did not drop, the drop in resistance is ignored. If the temperature did drop at the same time as the drop in resistance, an indication of a thermocouple short is issued by thermocouple diagnostics 406 and is transmitted to the control room and/or other process devices by communication interface 418. Thus, in such embodiments, the thermocouple temperature is used to verify that a short has occurred.

Temperature and Resistance Trend Test 466

Instead of comparing the thermocouple temperatures and resistances to thresholds, temperature and resistance trend test 466 determines trend lines for the temperature and resistance of the thermocouple and uses the slopes of those lines to identify when a short occurs in the thermocouple. Specifically, temperature and resistance trend test 466 periodically measures the resistance of thermocouple 106 and periodically stores thermocouple temperature 412. In one embodiment, with each new measured temperature 412, test 466 determines a temperature trend line, such as trend line 608 of FIG. 6, that is fit to the last n temperatures 412, such as the last five temperatures 412. The slope of the trend line is then examined to determine if it sufficiently negative to indicate that there is a short in the thermocouple. If the slope of the temperature trend line is sufficiently negative, a trend line for the resistance is determined, such as trend line 508 of FIG. 5, using the last m resistance values, such as the last five resistance values. The slope of the trend line for the resistance values is then examined to determine if it is sufficiently negative to indicate that there is a short in the thermocouple. If the slope of the resistance trend line is sufficiently negative, thermocouple diagnostics 406 issues an indication that there is a short in the thermocouple and communication interface 418 transmits this indication to the control room and/or other process devices.

In an alternative embodiment, with each new measured thermocouple resistance, test 466 determines a resistance trend line that is fit to the last n measured resistances, such as the last five measured resistances. The slope of the trend line is then examined to determine if it sufficiently negative to indicate that there is a short in the thermocouple. If the slope of the resistance trend line is sufficiently negative, a trend line for thermocouple temperatures 412 is determined using the last m temperature values, such as the last five temperature values. The slope of the trend line for the temperature values is then examined to determine if it is sufficiently negative to indicate that there is a short in the thermocouple. If the slope of the temperature trend line is sufficiently negative, thermocouple diagnostics 406 issues an indication of the thermocouple short and communication interface 418 transmits the indication to the control room and/or other process devices.

In still further embodiments, a combination of trend lines and thresholds is used to determine if a short exists in thermocouple 106. For example, differences between measured thermocouple resistances and baseline resistance 422 can be compared to a threshold and when the threshold is exceeded, a trend line for the thermocouple temperatures can be determined. The slope of the temperature trend line can then be examined to determine if it is sufficiently negative to indicate a short in the thermocouple. Alternatively, a drop in the thermocouple temperature over time can be compared to a threshold and when the drop in temperature exceeds a threshold, a trend line for the thermocouple resistances can be determined. If the slope of the resistance trend line is sufficiently negative, thermocouple diagnostics 406 issues the indication of a short in the thermocouple.

In-Line Thermocouple Resistance

In each of the tests described above, a change in the thermocouple resistance is used to identify when a short occurs in the thermocouple. The size of the change in resistance is a function of the resistance per unit length of the thermocouple conductors and the length of the conductors between the point where the short occurs and hot junction 120. If this length is short, the resulting change in the resistance can be too small to detect.

To improve the operation of the tests above, some embodiments incorporate a resistive element into thermocouple 106 so that there is a larger drop in resistance when a short occurs.

Figures 7, 8, 9, 10:
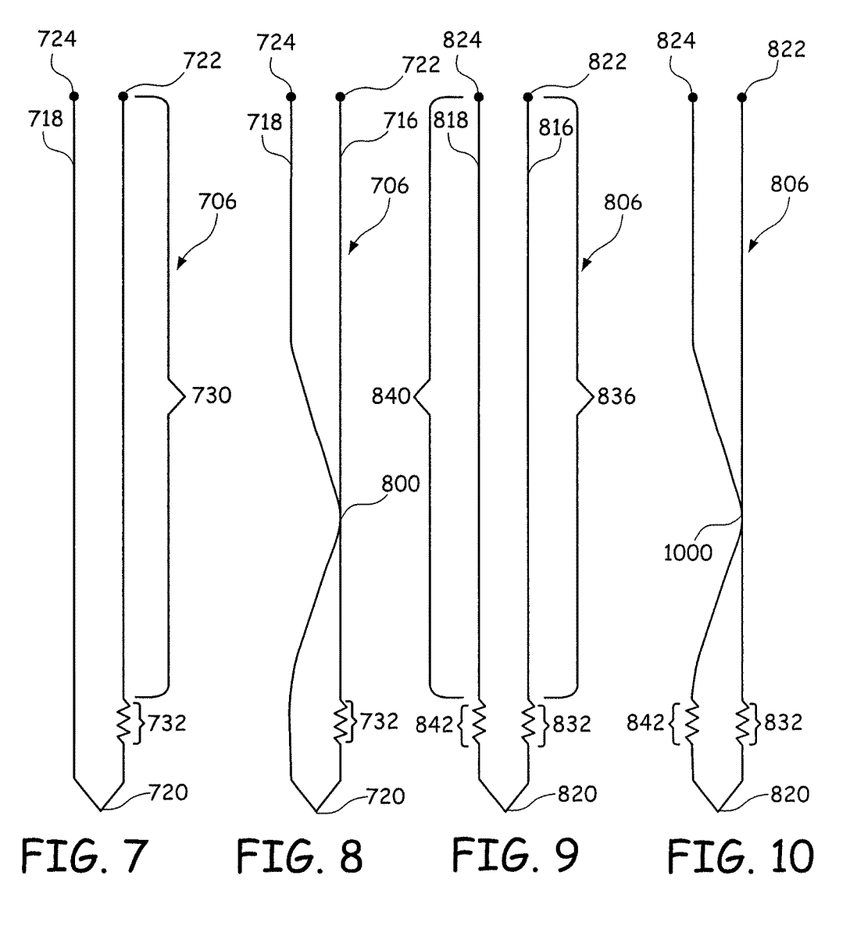
FIG. 7 provides an example of a thermocouple in accordance with a second embodiment.
FIG. 8 shows the thermocouple of FIG. 7 in a short condition.
FIG. 9 provides an example of a third embodiment of a thermocouple.
FIG. 10 shows the thermocouple of FIG. 9 in a short condition.

FIG. 7 provides a first embodiment of a thermocouple 706 that includes a resistive element and that can be used in place of thermocouple 106 in FIG. 4. Thermocouple 706 includes two conductors 716 and 718 that are joined together at a junction 720 and have free ends 722 and 724. Conductor 716 is shown to include two portions, a first portion 730 and a second portion 732, which acts as a resistive element. First portion 730 has a first resistance per unit length of the thermal couple and second portion 732 has a second resistance per unit length of the thermocouple where the second resistance per unit length is greater than the first resistance per unit length. Note that the resistances per unit length are relative to the length of the thermocouple and not the length of the conductors. A resistance per unit length of the thermal couple is measured by selecting two points along the thermocouple, measuring the distance between the two points along a straight line and dividing the resistance along the conductor between the two points by the distance. This is different from the resistance per unit length of the conductors which is measured by determining the length of conductor between two points and dividing the resistance by this length.

In accordance with one embodiment, the different resistances per unit length of the thermocouple are achieved by constructing second portion 732 so that it has a smaller cross-section than first portion 730. In accordance with a second embodiment, the different resistances per unit length of the thermocouple are achieved by bending or winding second portion 732 so that there is a greater length of the conductor per unit length of the thermocouple in second portion 732 than first portion 730.

In accordance with one embodiment, high-resistance portion 732 is between normal resistance portion 730 and junction 720. In particular, second portion 732 is positioned in thermocouple 706 such that it is below a point 800, shown in FIG. 8, where a short will cause the temperature 412 calculated by temperature calculations 410 to change. In other embodiments, second portion 732 is positioned as close as practicable to junction 720. In some embodiments, high-resistance portion 732 is shorter than normal-resistance portion 730 so as to localize the high-resistance portion on conductor 716.

As shown in FIG. 8, when a short condition exists at point 800, high-resistance portion 732 no longer adds to the resistance between free ends 722 and 724 that would be measured by thermocouple diagnostics 406. Since portion 732 has a higher resistance than other portions of thermocouple 706, the removal of the resistance due to portion 732 creates a larger change in the resistance than shown in FIG. 5. This larger change in resistance improves the operation of all of tests 460, 462, 464, and 466 described above.

In accordance with one embodiment, the threshold resistance change used in tests 460 and 464 is set so that the thermocouple resistance must change by at least the amount of resistance in high-resistance portion 732 in order for thermocouple diagnostics 406 to generate the indication that there is a short in the thermocouple. In such embodiments, thermocouple diagnostics 406 provides an indication of a short in the thermocouple when the measured resistance is less than the baseline resistance minus the resistance of high-resistance portion 732.

FIGS. 9 and 10 show an alternative thermocouple 806 having two in-line resistive elements 832 and 842 that can be used in place of thermocouple 106 in FIG. 4. Thermocouple 806 is formed of two conductors 816 and 818 that have free ends 822 and 824 and that are joined together at a junction 820. In thermocouple 806, two high-resistance portions 832 and 842 are included in the thermocouple with one high-resistance portion on each of conductors 816 and 818. Thus, conductor 816 consists of a first portion 836 having a first resistance per unit length of the thermocouple and second portion 832 having a second resistance per unit length of the thermocouple where the second resistance per unit length is greater than the first resistance per unit length. Similarly, conductor 818 consists of a first portion 840 that has a third resistance per unit length of the thermocouple and second portion 842, which has a fourth resistance per unit length of the thermocouple where the fourth resistance per unit length is greater than the third resistance per unit length. As shown in FIGS. 9 and 10, high-resistance portions 832 and 842 are positioned between normal-resistance portions 836, 840 and junction 820. In accordance with one embodiment, high-resistance portions 832 and 842 are position between a point 1000 and junction 820 where point 1000 represents the point where the voltage between free ends 822 and 824 will change during a short event thereby creating a change in the measured temperature 412. In other embodiments, high-resistance portions 832 and 842 are positioned as close as practicable to junction 820. In some embodiments, high-resistance portions 832 and 842 are shorter than normal-resistance portions 836 and 840 so as to localize the high-resistance portions on conductors 816 and 818.

By including high-resistance portions in both conductors, the drop in resistance when a short event occurs becomes larger making it easier to identify short events using the resistance alone or using the resistance in combination with changes in the temperature using any of tests 460, 462, 464 and 466 discussed above.

In accordance with one embodiment, the threshold resistance change used in tests 460 and 464 is set so that the thermocouple resistance must change by at least the amount of resistance in high-resistance portions 832 and 834 in order for thermocouple diagnostics 406 to generate the indication that there is a short in the thermocouple. In such embodiments, thermocouple diagnostics 406 provides an indication of a short in the thermocouple when the measured resistance is less than the baseline resistance minus the sum of the resistance of high-resistance portion 832 and the resistance of high-resistance portion 834.

Although the present invention has been described with reference to preferred embodiments, workers skilled in the art will recognize that changes may be made in form and detail without departing from the spirit and scope of the invention.

What is claimed is:

1. A temperature transmitter assembly comprising:
a thermocouple comprising a first conductor and a second conductor connected to each other at a junction wherein at least one of the first conductor and the second conductor comprise a first portion with a first resistance per unit length and a second portion with a second resistance per unit length; and
a temperature transmitter comprising diagnostics that determine a resistance of the thermocouple and based on the determined resistance, provide an indication of whether the first conductor and the second conductor are shorted together before the junction.

2. The temperature transmitter assembly of claim 1 wherein the diagnostics determine a baseline resistance of the thermocouple at a first time and a measured resistance at a second time later than the first time.

3. The temperature transmitter assembly of claim 2 wherein the second portion is closer to the junction than the first portion and the second resistance per unit length is greater than the first resistance per unit length and the second resistance per unit length of the second portion produces a resistance for the second portion and wherein the diagnostics provide the indication that the first conductor and second conductor are shorted together by determining that the measured resistance is less than the baseline resistance minus the resistance of the second portion.

4. The temperature transmitter assembly of claim 1 wherein the diagnostics determine a plurality of measured resistances over time and wherein the diagnostics use the plurality of measured resistances to determine a trend line for the measured resistance and provide the indication of whether the first conductor and second conductor are shorted together based on the trend line.

5. The temperature transmitter assembly of claim 1 wherein the diagnostics further:
receive a plurality of temperature values determined from the thermocouple over time;
determine a plurality of measured resistances over time; and
use the plurality of temperature values and the plurality of measured resistances to provide the indication of whether the first conductor and the second conductor are shorted together.

6. The temperature transmitter assembly of claim 5 wherein the diagnostics provide the indication of whether the first conductor and the second conductor are shorted together by correlating a change in the plurality of temperature values with a change in the plurality of measured resistances.

7. The temperature transmitter assembly of claim 6 wherein the plurality of temperature values are each determined at times other than when the diagnostics determine a measured resistance.

8. A temperature transmitter comprising:
a digital processor configured to execute:
temperature calculations that calculate a temperature of a portion of a thermocouple based on a measured voltage across the thermocouple; and
shorting diagnostics that determine a measured resistance of the thermocouple and that use the measured resistance and the temperature to determine whether conductors of the thermocouple have shorted together before a hot junction of the thermocouple; and
a communication interface that communicates that the conductors of the thermal couple have shorted together.

9. The temperature transmitter of claim 8 wherein the shorting diagnostics determine the resistance of the thermocouple based in part on voltages measured across the thermocouple.

10. The temperature transmitter of claim 9 wherein the temperature calculations calculate the temperature of the portion of the thermocouple based on voltages measured across the thermocouple at times other than when voltages are measured across the thermocouple to determine the resistance of the thermocouple.

11. The temperature transmitter of claim 8 wherein the digital processor is further configured to execute the temperature calculations such that the digital processor calculates a plurality of temperatures for the thermocouple based on a plurality of measured voltages across the thermocouple and the shorting diagnostics determine the measured resistance in response to the plurality of temperatures indicating a decrease in the temperature for the thermocouple.

12. The temperature transmitter of claim 11 wherein the shorting diagnostics establish a baseline resistance of the thermocouple before the plurality of temperatures indicates a decrease in the temperature of the thermocouple.

13. The temperature transmitter of claim 12 wherein the shorting diagnostics determine whether conductors of the thermocouple have shorted together by determining a difference between the baseline resistance and a resistance measured in response to the plurality of temperatures indicating a decrease in the temperature of the portion of the thermocouple.

14. The temperature transmitter of claim 13 wherein the shorting diagnostics determine that the conductors of the thermocouple have shorted together when the difference between the baseline resistance and the measured resistance exceeds an expected change in resistance given the decrease in the temperature of the portion of the thermocouple.

15. The temperature transmitter of claim 14 wherein the baseline resistance of the thermocouple comprise a resistance of a first portion of a first conductor of the thermocouple and a resistance of a second portion of the first conductor of the thermocouple, the first portion having a first resistance per unit length and the second portion having a second larger resistance per unit length.

16. A temperature transmitter comprising:
a processor that performs:
temperature calculations based on a voltage measured across points of a thermocouple to provide a temperature value for a junction of the thermocouple; and
diagnostics that determine a resistance of the thermocouple and based on the determined resistance, provide an indication of whether the first conductor and the second conductor are shorted together before the junction wherein the diagnostics prevent the processor from providing a temperature value when the resistance of the thermocouple is being determined.

17. The temperature transmitter of claim 16 wherein the diagnostics compare the determined resistance to a baseline resistance to determine whether the first conductor and the second conductor are shorted together.

18. The temperature transmitter of claim 16 wherein the diagnostics use the determined resistance and a temperature value to determine whether the first conductor and the second conductor are shorted together.

19. The temperature transmitter of claim 18 wherein the diagnostics use trends in the determined resistance and trends in the temperature values to determine whether the first conductor and the second conductor are shorted together.

\* \* \* \* \*